US010108357B2

(12) United States Patent
Jeffrey et al.

(10) Patent No.: US 10,108,357 B2
(45) Date of Patent: Oct. 23, 2018

(54) DETECTION OF MULTIPLE ACCESSES TO A ROW ADDRESS OF A DYNAMIC MEMORY WITHIN A REFRESH PERIOD

(71) Applicant: Oracle International Corporation, Redwood City, CA (US)

(72) Inventors: David Jeffrey, Santa Cruz, CA (US); Clement Fang, Cupertino, CA (US); Neil Duncan, Pleasanton, CA (US); Heechoul Park, San Jose, CA (US); Lik Cheng, San Jose, CA (US); Gregory F. Grohoski, Bee Cave, TX (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/145,283

(22) Filed: May 3, 2016

(65) Prior Publication Data

US 2016/0246525 A1 Aug. 25, 2016

Related U.S. Application Data

(63) Continuation of application No. 13/971,288, filed on Aug. 20, 2013, now Pat. No. 9,355,689.

(51) Int. Cl.
*G06F 12/00* (2006.01)
*G06F 13/00* (2006.01)
(Continued)

(52) U.S. Cl.
CPC .......... *G06F 3/0619* (2013.01); *G06F 3/0653* (2013.01); *G06F 3/0673* (2013.01);
(Continued)

(58) Field of Classification Search
CPC ......... G11C 11/40611; G11C 11/40622; G11C 11/4085; G11C 11/4087; G11C 7/02; G06F 3/0619; G06F 3/0653; G06F 3/0673
(Continued)

(56) References Cited

U.S. PATENT DOCUMENTS 5,596,521 A * 1/1997 Tanaka ................ G06F 12/0893
365/149
5,982,398 A * 11/1999 Yamamoto ................ G06T 1/60
345/422
(Continued)

*Primary Examiner* — Sheng-Jen Tsai
(74) *Attorney, Agent, or Firm* — Meyertons, Hood, Kivlin, Kowert & Goetzel, P.C.

(57) ABSTRACT

Embodiments of a row address cache circuit are disclosed that may allow the determination the number of times a row address is used to access a dynamic memory. The row address cache circuit may include a memory, first and second pluralities of counters, and a control circuit. The control circuit may be configured to receive a row address and store the row address in an entry of the memory when the row address has not been previously stored. When the row address has been previously stored in an entry of the memory, the control circuit may be configured to change a value of a counter of the first plurality of counters corresponding the entry. The control circuit may be further configured to change a value of each counter of the second plurality of counters after a pre-determined time interval has elapsed, and initiate a refresh of the dynamic memory.

13 Claims, 7 Drawing Sheets

(51) Int. Cl.
   *G06F 13/28*    (2006.01)
   *G06F 3/06*     (2006.01)
   *G11C 7/02*     (2006.01)
   *G11C 11/406*   (2006.01)
   *G11C 11/408*   (2006.01)

(52) U.S. Cl.
   CPC .......... *G11C 7/02* (2013.01); *G11C 11/40611* (2013.01); *G11C 11/40622* (2013.01); *G11C 11/4085* (2013.01); *G11C 11/4087* (2013.01)

(58) Field of Classification Search
   USPC ....................................................... 711/106
   See application file for complete search history.

(56) References Cited

U.S. PATENT DOCUMENTS

| | | | | |
|---|---|---|---|---|
| 6,061,290 | A | 5/2000 | Shirley | |
| 7,072,237 | B2* | 7/2006 | Morgan | G11C 5/14 365/190 |
| 7,272,039 | B2 | 9/2007 | Rudeck et al. | |
| 7,345,837 | B1* | 3/2008 | Schreck | G11B 5/09 360/31 |
| 8,854,760 | B1* | 10/2014 | Lu | G11B 20/10388 360/31 |
| 9,721,643 | B2* | 8/2017 | Bains | G11C 11/4078 |
| 9,747,971 | B2* | 8/2017 | Bains | G11C 11/40618 |
| 9,865,326 | B2* | 1/2018 | Bains | G11C 11/4091 |
| 2001/0050873 | A1* | 12/2001 | Tanaka | G06F 12/0893 365/205 |
| 2003/0028711 | A1* | 2/2003 | Woo | G06F 1/3225 711/106 |
| 2003/0088742 | A1* | 5/2003 | Lee | G06F 12/084 711/147 |
| 2003/0227791 | A1* | 12/2003 | Vo | G11C 7/02 365/149 |
| 2003/0227801 | A1* | 12/2003 | Battaglia | G06F 12/0893 365/200 |
| 2005/0002253 | A1* | 1/2005 | Shi | G11C 11/406 365/222 |
| 2007/0086261 | A1* | 4/2007 | Freebern | G11C 8/04 365/230.03 |
| 2007/0086266 | A1* | 4/2007 | Freebern | G11C 8/12 365/230.08 |
| 2007/0106860 | A1* | 5/2007 | Foster, Sr. | G06F 1/3225 711/170 |
| 2007/0239930 | A1* | 10/2007 | Hearn | G06F 13/1636 711/106 |
| 2009/0172267 | A1* | 7/2009 | Oribe | G11C 16/3418 711/103 |
| 2010/0213535 | A1 | 8/2010 | Kathawala et al. | |
| 2011/0302352 | A1* | 12/2011 | Lee | G11C 11/5628 711/102 |
| 2013/0132652 | A1* | 5/2013 | Wood | G06F 12/0246 711/103 |
| 2013/0304982 | A1* | 11/2013 | Jung, II | G11C 11/40622 711/106 |
| 2014/0006703 | A1* | 1/2014 | Bains | G11C 11/40618 711/106 |
| 2014/0006704 | A1* | 1/2014 | Greenfield | G06F 11/3037 711/106 |
| 2014/0016421 | A1* | 1/2014 | Kim | G11C 7/00 365/222 |
| 2014/0059287 | A1* | 2/2014 | Bains | G11C 11/40615 711/106 |
| 2014/0071559 | A1* | 3/2014 | Toda | G11B 20/1879 360/55 |
| 2014/0085995 | A1* | 3/2014 | Greenfield | G11C 7/24 365/201 |
| 2014/0089576 | A1* | 3/2014 | Bains | G11C 16/00 711/106 |
| 2014/0095780 | A1* | 4/2014 | Bains | G11C 11/406 711/105 |
| 2014/0156923 | A1* | 6/2014 | Bains | G11C 11/4078 711/106 |
| 2014/0177370 | A1* | 6/2014 | Halbert | G11C 11/40603 365/222 |
| 2014/0189228 | A1* | 7/2014 | Greenfield | G11C 11/40607 711/106 |
| 2014/0219043 | A1* | 8/2014 | Jones | G11C 8/10 365/230.06 |
| 2014/0281206 | A1* | 9/2014 | Crawford | G11C 11/406 711/106 |
| 2014/0281207 | A1* | 9/2014 | Mandava | G11C 14/0009 711/106 |
| 2014/0344513 | A1* | 11/2014 | Lo | G11C 7/04 711/106 |
| 2015/0058549 | A1* | 2/2015 | Jeffrey | G11C 7/02 711/106 |
| 2015/0109871 | A1* | 4/2015 | Bains | G06F 13/1636 365/222 |
| 2015/0234747 | A1* | 8/2015 | Tanaka | G06F 12/0875 711/125 |
| 2016/0004645 | A1* | 1/2016 | Dey | G06F 12/0808 711/135 |
| 2017/0103795 | A1* | 4/2017 | Crawford | G11C 11/406 |
| 2017/0365324 | A1* | 12/2017 | Bains | G11C 11/4078 |

* cited by examiner

DETECTION OF MULTIPLE ACCESSES TO A ROW ADDRESS OF A DYNAMIC MEMORY WITHIN A REFRESH PERIOD

CROSS-REFERENCE TO RELATED APPLICATIONS

This application is a continuation of U.S. patent application Ser. No. 13/971,288 entitled "DETECTION OF MULTIPLE ACCESSES TO A ROW ADDRESS OF A DYNAMIC MEMORY WITHIN A REFRESH PERIOD," filed on Aug. 20, 2013, whose disclosure is hereby incorporated by reference in its entirety as though fully and completely set forth herein.

BACKGROUND

Technical Field

This invention is related to the field of high-speed interface design, and more particularly to AC coupling techniques.

Description of the Related Art

Computing systems typically include a number of interconnected integrated circuits, such as, e.g., processors, memories, and multiple Application-Specific Integrated Circuits (ASICs). Some computing systems may be coupled to external data entry, display, and storage devices. The computing systems may be configured to perform specialized computing tasks or to execute a sequence of program instructions that may be stored in memory, or peripheral storage devices. Such computing systems may be configured as desktop systems, laptop systems, or cellular telephones.

Memories within a computing system may be configured to store program instructions retrieved from an external storage device, such as, e.g., a hard-disk drive, or a compact disc, or to store data used during the execution of program instructions. For example, a memory may store graphics data before the data is sent to a display device. A computing system may make use of various types of memories. Types of memories employed within a computing system may include, without limitation, Static Random Access Memory (SRAM), Dynamic Random Access Memory (DRAM), Read-Only Memory (ROM), Electrically Erasable Programmable Read-only Memory (EEPROM), a FLASH memory, Phase Change Memory (PCM), or a Ferroelectric Random Access Memory (FeRAM), and the like.

In some computing systems, DRAM may be used in situations where a large number of bits are required such as, system memory, for example. DRAMs typically store data by charging and discharging small capacitors included within a DRAM data storage cell. As with most capacitors, DRAM data storage cell capacitors may lose charge over time. This phenomenon is commonly referred to as "leakage." To prevent data loss due to leakage, the charge in DRAM data storage cells must be periodically replenished or refreshed.

SUMMARY OF THE EMBODIMENTS

Various embodiments of a row address cache circuit are disclosed. Broadly speaking, a system and method are contemplated in which a row address cache circuit may track the number of times a row address is used to access a dynamic memory. The row address cache circuit may include a memory, a first plurality of counters, a second plurality of counters, and a control circuit. The memory may include a plurality of entries, each entry configured to store a row address. The control circuit may be configured to receive a row address used to access a dynamic memory, and, store the received row address in an entry of the memory in response to determining the received address is not currently stored in the memory. The control circuit may be further configured to, in response to a determination that the received row address is stored in an entry of the memory, increment a corresponding counter of the first plurality of counters corresponding to the entry, change a value of each counter of the second plurality of counters responsive to a determination that a pre-determined time interval has elapsed, and initiate a refresh of the dynamic memory dependent upon values of counters of the first and second pluralities of counters.

In one embodiment, to initiate the refresh of the dynamic memory, the control circuit may be further configured to send a refresh signal to the dynamic memory. In a specific embodiment, to initiate the refresh of the dynamic memory, the control circuit may be further configured to retire the entry in the memory corresponding to the received row address.

In another non-limiting embodiment, to retire the entry in memory, the control circuit may be further configured to reset a status bit. The status bit may indicate that the entry in memory is available for storing a new row address.

BRIEF DESCRIPTION OF THE DRAWINGS

The following detailed description makes reference to the accompanying drawings, which are now briefly described.

Figure 1:
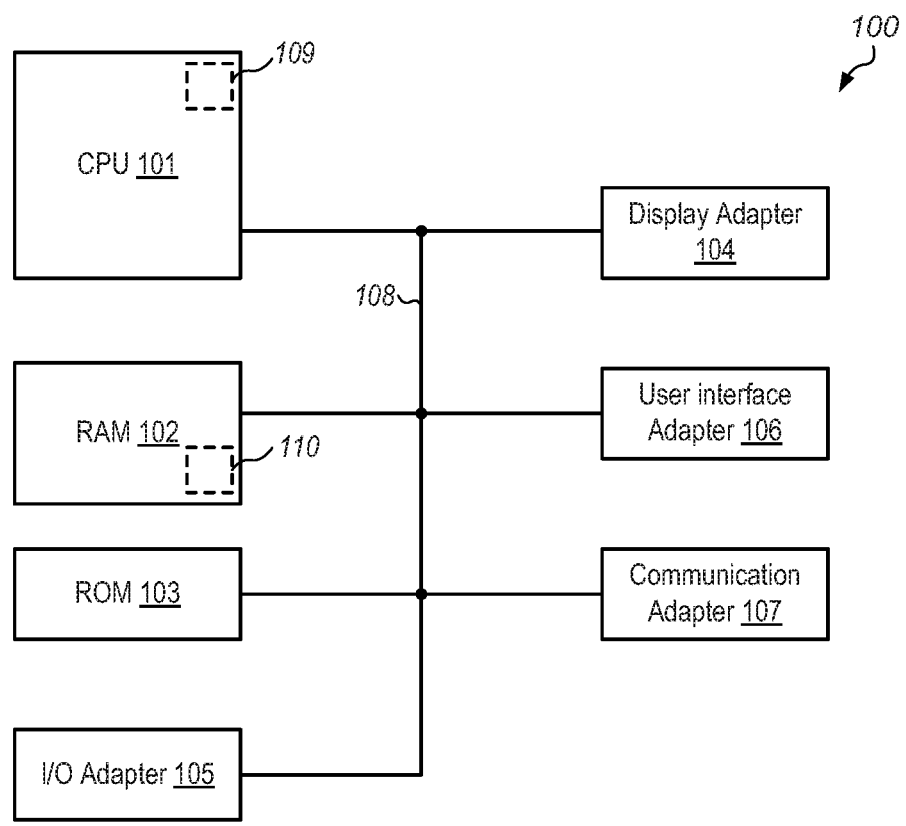
FIG. 1 illustrates an embodiment of a computing system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph six interpretation for that unit/circuit/component. More generally, the recitation of any element is expressly intended not to invoke 35 U.S.C. § 112, paragraph six interpretation for that element unless the language "means for" or "step for" is specifically recited.

DETAILED DESCRIPTION OF EMBODIMENTS

A computing system may include one or more integrated circuits such as, e.g., a central processing unit (CPU) and memories. The computing system may be configured to perform various computing tasks by executing program instructions stored in one or more memories. During operation a processor or CPU may access system memory to retrieve program instructions or to store data for use in later processing tasks. For example, a processor may store an intermediate value in a lengthy computation in system memory, or video or graphics data may be buffered prior to being re-formatted and sent to a display.

In some embodiments, DRAM may be employed as system memory. Due to the dynamic nature of the storage mechanism used in DRAM (data is stored as charge on a capacitor), DRAMs must be periodically refreshed. During a refresh operation, a DRAM may replenish charge lost from a data storage cell due to leakage or other mechanisms. In various embodiments, a read or write operation may not be performed to a DRAM while it is operating in refresh mode.

Repeated accesses to a single row within a DRAM may, in some embodiments, result in a loss of charge in data storage cells adjacent to the row being repeatedly accessed. To prevent loss of data, the DRAM must be refreshed more frequently when such a situation occurs, thereby reducing overall system performance. The embodiments illustrated in the drawings and described below may provide techniques for determining how often a row within a DRAM is accessed, thereby allowing adjacent rows within a DRAM to be selectively refreshed, reducing the need to refresh the entire DRAM.

Computer System Overview

A block diagram of a computing system is illustrated in FIG. 1. In the illustrated embodiment, computing system 100 includes a CPU 101 coupled to Random Access Memory (RAM) 102, Read-only Memory (ROM) 103, and display adapter 104. CPU 101 is additionally coupled to input/output (I/O) adapter 105, user interface adapter 106, and communications adapter 107. In various embodiments, computing system 100 may be configured as a desktop system, a laptop system, or in any suitable form factor.

RAM 102 may include any suitable type of memory, such as Fully Buffered Dual Inline Memory Module (FB-DIMM), Double Data Rate or Double Data Rate 2 Synchronous Dynamic Random Access Memory (DDR/DDR2 SDRAM), or Rambus® DRAM (RDRAM®), for example. In various embodiments, RAM 102 may store program instructions to be executed by CPU 101, graphics data to be sent to a display by display adapter 104, or any other suitable information to be used by computing system 100. In some embodiments, RAM 102 may include cache circuit such as, e.g., cache circuit 110, configured to track the number of times a given row address within RAM 102 is accessed. It is noted that although one RAM is shown, in various embodiments, any suitable number of RAMs may be employed.

CPU 101 may implement any suitable instruction set architecture (ISA), such as, e.g., the ARM™, PowerPC™, or x86 ISAs, or combination thereof. In some embodiments, CPU 101 may include one or more processor cores configured to implement one of the aforementioned ISAs. CPU 101 may also include one or more cache memories which may be configured to store instructions and/or data during operation. In other embodiments, CPU 101 may include a cache memory such as, e.g., cache memory 109, specifically configured to determine a number of times a given row address is used to access RAM 102.

In some embodiments, bus 108 may be a high-speed serial interface that may conform to an industry standard specification, such as, e.g., PCI Express™, or MIPI Physical Layer. In some embodiments, the various circuits block, such as, e.g., CPU 101, RAM 102, and the like, may communicate amongst themselves employing bus 108.

ROM 103 may be configured to store instructions to be executed by CPU 101. In some embodiments, ROM 103 may store instructions necessary for initial boot-up and configuration of CPU 101. The stored instructions may include, in some embodiments, instructions to perform a power-on self-test (POST) that may allow CPU 101 to test embedded cache memories and other circuit blocks that may reside on CPU 101. In some embodiments, ROM 103 may be mask-programmable using a metal, polysilicon, contact, implant, or any suitable mask layer available on a semiconductor manufacturing process.

I/O adapter 105 may be configured to coordinate data transfer between CPU 101 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O adapter 105 may be configured to implement a version of Universal Serial Bus (USB) protocol or IEEE 1394 (Firewire®) protocol.

Communication adapter 107 may be configured to coordinate data transfer between CPU 101 and one or more devices (e.g., other computer systems) coupled to CPU 101 via a network. In one embodiment, communication adapter 107 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, communication adapter 107 may be configured to implement multiple discrete network interface ports.

User interface adapter 106 may be configured to transfer data between one or more peripheral devices configured to input data into computing system 100. In one embodiment, user interface adapter 106 may receive input from a keyboard and transfer the data to CPU 101. In other embodiments, user interface adapter 106 may receive and format data from a mouse or other suitable pointing device.

Display adapter 104 may be configured to transfer and format data from between CPU 101 and a display screen. In some embodiments, display adapter 104 may be configured to implement a display standard such as Super-VGA or High-Definition Multimedia Interface (HDMI). In other embodiments, display adapter 104 may be configured to implement multiple display interfaces.

It is noted that the embodiment illustrated in FIG. 1 is merely an example. In other embodiments, different functional blocks and different configurations of functional blocks are possible and contemplated.

Dynamic Memories

Figure 2:
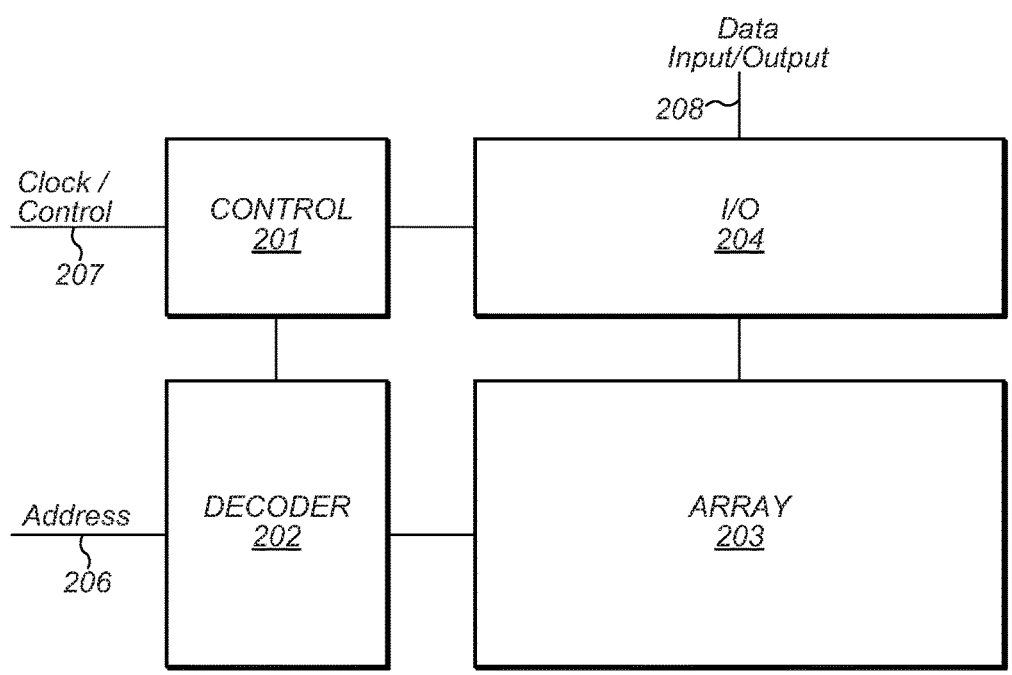
FIG. 2 illustrates an embodiment of a Dynamic Random Access Memory (DRAM).

Turning to FIG. 2, an embodiment of a Dynamic Random Access Memory (DRAM) is illustrated. DRAM 200 may, in some embodiments, corresponding to RAM 102 of computing system 100 as illustrated in FIG. 1. In the illustrated embodiments, DRAM 200 includes control unit 201, decoder unit 202, array 203, and input/output (I/O) unit 204. Control unit 201 is coupled clock/control signals 207, I/O unit 204, and decoder unit 202. Array 203 is coupled to decoder unit 202 and I/O unit 204, which are coupled to address bus 206 and data input/output signals 208, respectively.

Control unit 201 may, in various embodiments, be configured to receive clock and control signals that govern the operation of DRAM 200. In some embodiments, control unit 201 may include a state machine or other suitable logic circuit that is configured to provide timing signals to I/O unit 204 to operate data input/output latches, sense amplifiers, and the like. Control unit 201 may also be configured to provide enable and/or timing signals to decoder unit 202. In various embodiments, control unit 201 may determine the operational mode, such as, e.g., read, write or refresh, of DRAM 200. In some embodiments, refresh mode may include replenishing charge within the data storage cells.

In some embodiments, decoder unit 202 may be configured to receive an address via address bus 206, and then decode the received address to select one or more data storage cells within array 203. The received address may, in various embodiments, contain a row address and a column address. In some embodiments, the row address and column address may be multiplexed in time onto a single set of physical wires. The row address and column address may be decoded separately, and separate row and column selection signals provided to array 203. Decoder unit 202 may used decode circuits design in one of various design styles including static and dynamic circuit design styles.

Array 203 may, in various embodiments, include multiple data storage cells. The data storage cells may be arranged in a physical array consisting of multiple rows and columns. Each row may include multiple data storage cells each of which may be coupled to a unique bit line (also referred to herein as a "digit line"). Each data storage cell may include an n-channel metal-oxide semiconductor field-effect transistor (MOSFET) coupled between a bit line and a capacitor (commonly referred to as the "pass device" or "pass transistor"). Each capacitor may be further coupled to a common circuit node within the array (commonly referred to as the "cell plate"). In some embodiments, the cell plate may be at a voltage level at or near ground, at a voltage level below ground, or at any other suitable voltage level.

In various embodiments, I/O unit 204 may include multiple sense amplifiers each of which may be configured to amplify data on bit lines in array 203. The sense amplifiers may be designed in accordance with various circuit design styles such as, e.g., latching comparator, analog differential amplifiers, and the like. I/O unit 204 may also include multiple data input latches each of which is configured to latch data to be stored in array 203, multiple output latches each of which is configured to store amplified data from the multiple sense amplifiers, and write circuitry configured to drive data onto the bit lines of array 203 in order to store data into the data storage cells within array 203.

In some embodiments, multiple arrays, such as, e.g., array 203, and multiple decoder units, such as, e.g., decoder unit 202 may be included within a DRAM. In such configurations, the individual arrays (also referred to herein as "banks") may be operated independently thereby allowing higher bandwidth access to the DRAM. For example, in various embodiments, data may be read from one array, while another array may be initialized (commonly referred to as being "pre-charged") in preparation for an access, or refreshed. Careful organization of data may allow, in various embodiments, constant access to a multi-bank DRAM.

It is noted that DRAM 200 is merely an example. In other embodiments, different functional blocks and different arrangements of functional blocks may be employed.

Figure 3:
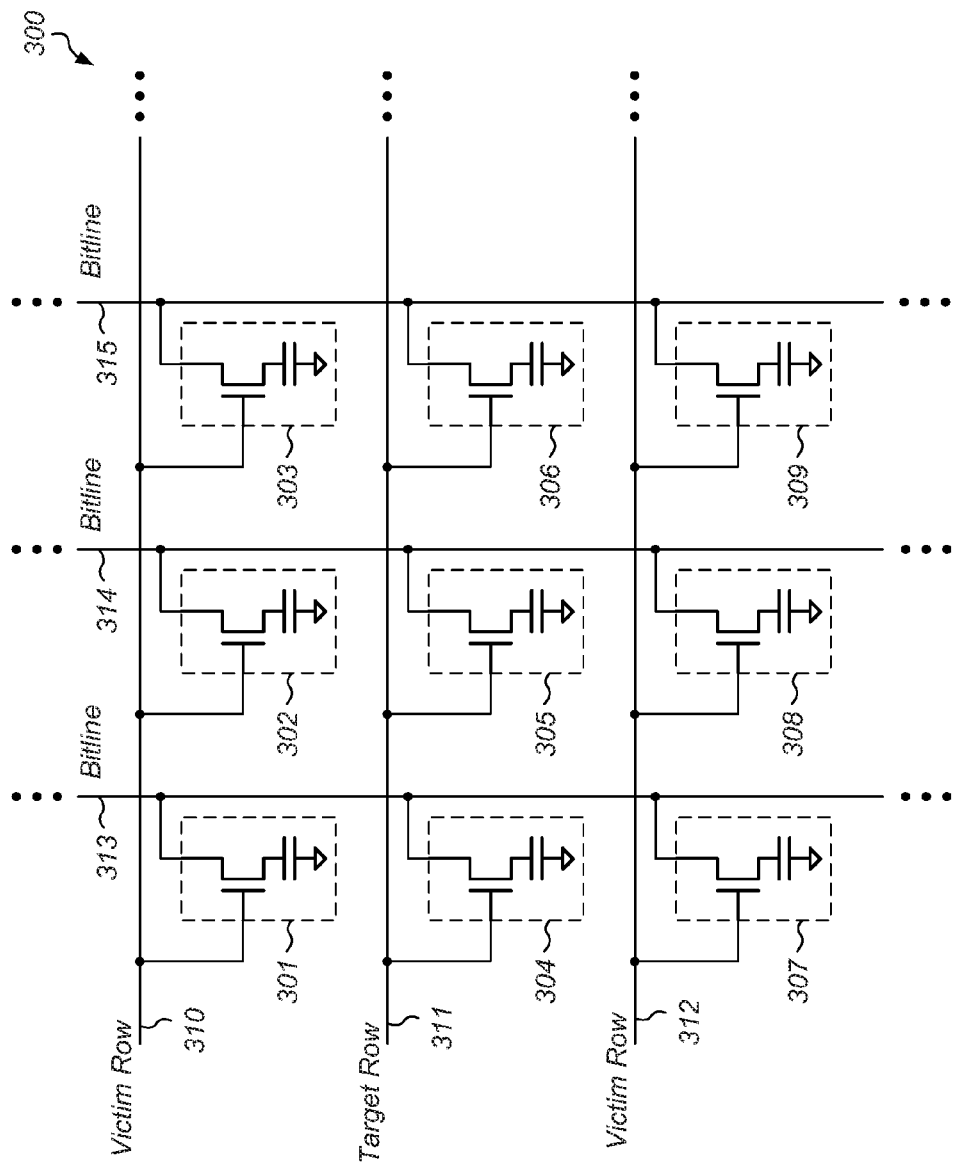
FIG. 3 illustrates an embodiment of a DRAM array.

An embodiment of a DRAM array is illustrated in FIG. 3. Array 300 may, in some embodiments, correspond to array 203 of DRAM 200 as illustrated in FIG. 2. In the illustrated embodiment, array 300 includes data storage cells 301 through 309. Data storage cells 301 through 303 are controlled by victim row 310, and are coupled to bit lines 313 through 315, respectively Data storage cells 304 through 306 are controlled by target row 311, and are coupled to bit lines 313 through 315, respectively. Data storage cells 307 through 309 are controlled by victim row 312, and are coupled to bit lines 313 through 315, respectively.

During operation, bit lines 313 and 315 may be pre-charged to a pre-determined voltage level, and rows 310 through 312 may be set to a low logic level. In some embodiments, the pre-determined voltage level may be half of the voltage level of the power supply, or any other suitable voltage level. A row is the selected for access. In some embodiments, a row to be accessed may be referred to as a "target row." In the illustrated embodiment, target row 311 may then be transitioned to a high logic level, thereby activating data storage cells 304 through 306. Dependent upon the amount of charge stored on the capacitor of each data storage cell, a small positive or negative change in the pre-charge voltage level of bit lines 313 through 315 may occur. For example, in cases where the capacitor of a data storage cell is not charged, a small amount of charge from a bit line may transfer to into the memory cell to charge the capacitor within the data storage cell. The transfer of charge from the bit line to the capacitor may result in a smaller voltage on the bit line. The difference, either positive or negative, from the pre-charged voltage level on bit lines 313 through 315 may then be amplified by sense amplifiers, such as what may be included in I/O unit 204 of DRAM 200 as illustrated in FIG. 2, to generate digital signals corresponding to the stored data in the data storage cells 304 through 306.

It is noted that in this embodiment, low or low logic level refers to a voltage at or near ground potential and high or high logic level refers to a voltage sufficiently large to turn on n-channel MOSFET transistors and turn off p-channel MOSFET transistors. It other embodiments, other circuit configurations may be used and the voltages that constitute low and high may be different.

In some embodiments, a single row, such as target row 311, may be repeatedly activated. When the target row is activated, data storage cells in adjacent rows may be affected. De-selected rows that are affected by the activation of a target row are commonly referred to as "victim rows." In the embodiment illustrated in FIG. 3, victim row 310 and victim row 312 may be affected with the activation of target row 311. Capacitors within data storage cells on the adjacent rows may, in various embodiments, be partially discharged by the repeated activation of the target row. In some embodiments, the partial discharge of the capacitors may be the result of capacitive coupling between the target row and nearby rows. The capacitive coupling may partially activate the pass device within data storage cells coupled controlled by the adjacent rows, resulting in a small amount of charge leaking from the capacitors onto the bit lines.

In other embodiments, repeated activation of the target row may generate carriers in the semiconductor substrate that may recombine with the charge stored in the capacitors of adjacent data storage cells, thereby reducing the charge level within the capacitor. Data storage cells with reduced levels of charge may, in various embodiments, produced a signal of the bit line which is too small to be properly amplified, resulting in an incorrect digital signal.

Typically, DRAMs are periodically refreshed to account for inherent leakage in the capacitors of data storage cells. In cases, such as those described above where a single row is repeatedly access (commonly referred to as a "row hammer"), more frequent refresh of adjacent data storage cells may be necessary. In some cases, data from a manufacturer may be employed to determine how often such data storage cells need to be refreshed when they are adjacent to a row being repeatedly accessed. In other embodiments, empirical data may be used to determined how frequently adjacent data storage cells need to be refreshed during a row hammer event.

It is noted that the embodiment illustrated in FIG. 3 is merely an example. In other embodiments, different numbers of data storage cells, and different types of data storage cells are possible and contemplated.

Monitoring Repeated Accesses

Figure 4:
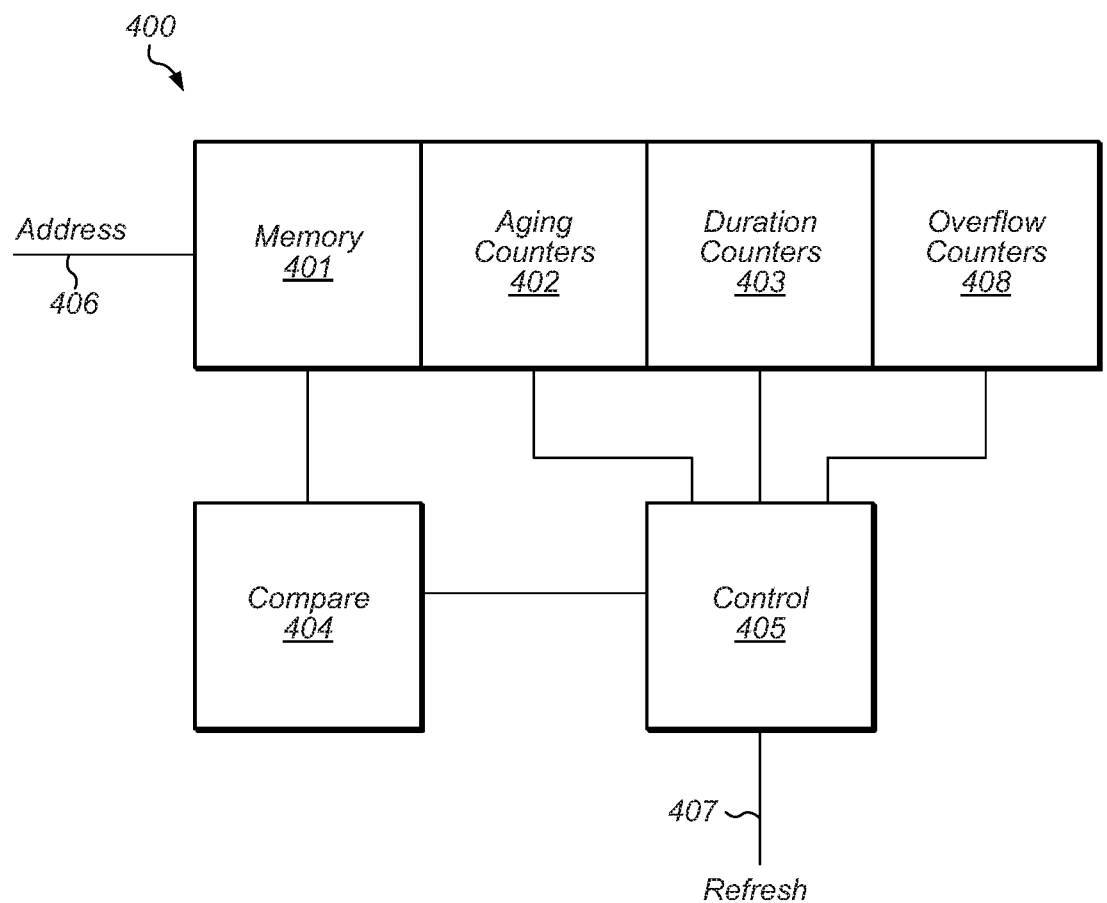
FIG. 4 illustrates an embodiment of a row address cache circuit.

Turning to FIG. 4, an embodiment of a row address cache circuit is illustrated. In some embodiments, row address cache circuit 400 may correspond to cache circuits 109 and 110 as depicted in FIG. 1. In other embodiments, row address cache circuit 400 may be included as a separate functional block coupled to a system bus, such as bus 108 as illustrated in FIG. 1.

In the illustrated embodiment, row address cache circuit 400 includes memory 401, aging counters 402, duration counters 403, overflow counters 408, compare circuit 404, and control circuit 405. Memory 401 is coupled to aging counters 402, duration counters 403, and overflow counters 408, which are further coupled to control circuit 405. Compare circuit is coupled to memory 401 and control circuit 405.

In some embodiments, memory 401 may include multiple entries, each entry configured to store a row address received via address bus 406. Each entry may include multiple data bits necessary to store the full bit width of a row address. In various embodiments, a status bit may be included with each entry to store information indicative of if the entry is being used. In other embodiments, memory 401 may employ content addressable memory (CAM) cells. A CAM cell may allow the comparison of stored data with a comparison bit. The result of the individual CAM cell comparisons may be combined to determine if larger number of bits match an input comparison word. Memory 401 may, in various embodiments, be implemented as a register file or any other suitable storage circuit.

Aging counters 402 may, in various embodiments, contain a number of counters equal to the number of entries in memory 401. In some embodiments, each time an address is received, and the received address is stored in an entry of memory 401, a value of the corresponding aging counter may be changed. In various embodiments, the value of the corresponding aging counter may be incremented while, in other embodiments, the value of the corresponding aging counter may be decremented. The counters included in aging counters 402 may be designed according to one of various design styles. In some embodiments, the counters may be asynchronous ripple counters while, in other embodiments, the counters may be synchronous counters. Each counter may be configured to count up or down dependent upon a control signal. In various embodiments, each counter may also be configured to reset to a pre-determined value, such as, e.g., zero, in response to the assertion of a control signal or the detection of a particular event.

In a similar fashion, duration counters 403 may include a number of counters equal to the number of entries in memory 401. In some embodiments, each counter of included in duration counters 403 may increment after a time period has passed. The time period may, in various embodiments, correspond to a portion of the refresh time of a DRAM, such as, e.g., DRAM 200 as illustrated in FIG. 2, or any other suitable time interval. As described above with regards to aging counters 402, duration counters may be implemented in various styles with various features.

Overflow counters 408 may, in various embodiments, include multiple entries each of which may store an address previously stored in memory 401. In some embodiments, an entry from memory 401 may be moved to an entry in overflow counters 408 when it is determined that an address received on address bus 406 needs to be stored in memory 401 and there are no available entries in memory 401. The entry moved from memory 401 may, in some embodiments, be an entry with the largest value in the corresponding counter in duration counters 403. In some embodiments, each entry in overflow counters 408 may also include a counter which may be incremented in response each time a given address is moved from an entry in memory 401 to an entry in overflow counters 408.

Compare circuit 404 may, in some embodiments, be configured to compare a received address to the contents of memory 401. In some embodiments, compare circuit 404 may sequentially access each entry of memory 401 and perform a bitwise comparison of the stored row address to the received address. The bitwise comparison may, in various embodiments, include performing an exclusive-OR (XOR) operation, or any other suitable combination of Boolean operations. In other embodiments, memory 401 may be implemented as a CAM, and compare circuit 404 may logically combine one or more match lines from the CAM to complete the final comparison.

In some embodiments, control circuit 405 may check the value of an aging counter corresponding to a received address. Control circuit 405 may then initiate a refresh of a DRAM dependent upon the value of the aging counter. In other embodiments, control circuit 405 may also check the value of the corresponding duration counter in order to determine if a refresh is necessary. In some embodiments, the refresh may include the entire address range of the DRAM while, in other embodiments, the refresh may only include a portion of the address range with a similar physical location to the received address.

To initiate the refresh, control circuit 405 may send refresh signal 407 to a processor, such as, e.g., processor 101 of computing system 100, requesting the processor send a refresh command to the DRAM. In some embodiments, control circuit 405 may send a signal directly to a DRAM control circuit, such as, control unit 201 of DRAM 200 as illustrated in FIG. 2. The signal sent by control circuit 405 may, in various embodiments, include the received address, adjacent row addresses, or a combination thereof. Control circuit 405 may, in some embodiments, also include a timer circuit that may be configured to determine the passage of a pre-determined period of time. Once the pre-determined period of time has elapsed, control circuit 405 may signal duration counters 403 to increment.

It is noted that the embodiment illustrated in FIG. 4 is merely an example. In other embodiments, different numbers of memories and counters may be employed to operate in conjunction with a multi-bank DRAM.

Figure 5:
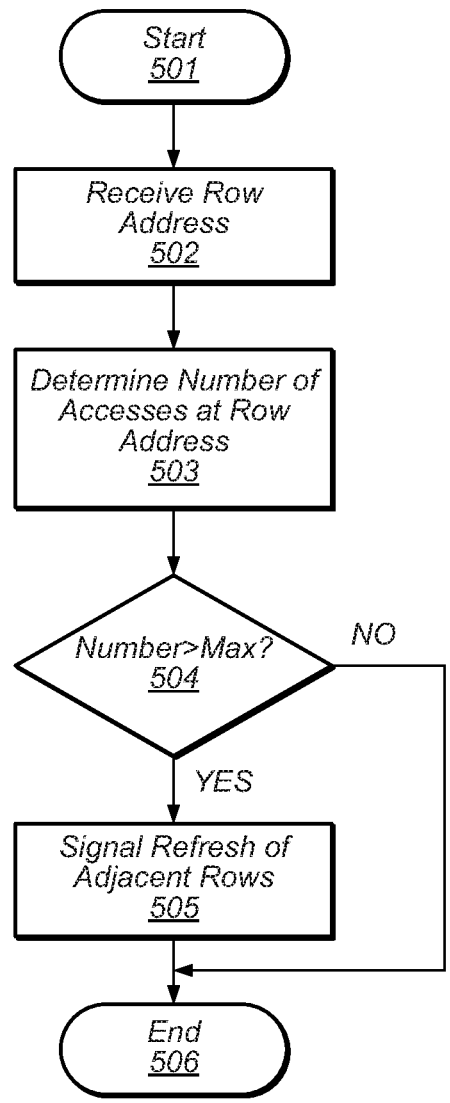
FIG. 5 illustrates a flowchart of an embodiment of a method of operating a row address cache circuit.

A flowchart depicting a method of operating a row address cache circuit, such as, e.g., row address cache circuit 400 as depicted in FIG. 4, is illustrated in FIG. 5. The method begins in block 501. A row address may then be received (block 502). The row address may, in various embodiments, correspond to an access of a memory such as, e.g., RAM 102 as depicted in FIG. 1, by one of various processors that may be included in a computing system. In some embodiments, the row address may be received via a communication bus such as, e.g., bus 108 as illustrated in computing system 100. The received row address may, in other embodiments, be multiplexed in time with other address information such as a column address, for example.

Once the row address has been received, a determination of the number of times the row address has recently been employed to access a memory (block 503). In some embodiments, the determination may be made using the values of counters that are configured to increment each time a given row address is employed. A timer may, in various embodiments, be employed to determine how much time has passed since the last refresh of the memory being accessed using the row address. In various embodiments, one or more of the counters may be reset when the time passed since the last refresh exceeds a pre-determined value. The pre-determined value may, in some embodiments, be dependent upon the refresh rate of the memory being accessed.

The method may then depend on the number of times the received row address has been used to access a memory (block 504). When the number of accesses is less than or equal to a pre-determined maximum value, the method may then complete in block 506. In some embodiments, the pre-determined value may be provided by a manufacturer of the memory being accessed while, in other embodiments, the pre-determined value may be the result of characterization data performed on the memory.

When the number of accesses is greater than the pre-determined maximum value, the row address cache circuit may signal to the processing accessing the memory to perform a refresh on adjacent row addresses. In some embodiments, by performing a refresh on adjacent rows to the received row address, corruption of data stored in the adjacent rows may be avoided.

Although the various operations depicted in the method illustrated in FIG. 5 are shown as being performed in a sequential fashion, in other embodiments, one or more of the operations may be performed in parallel.

Figure 6:
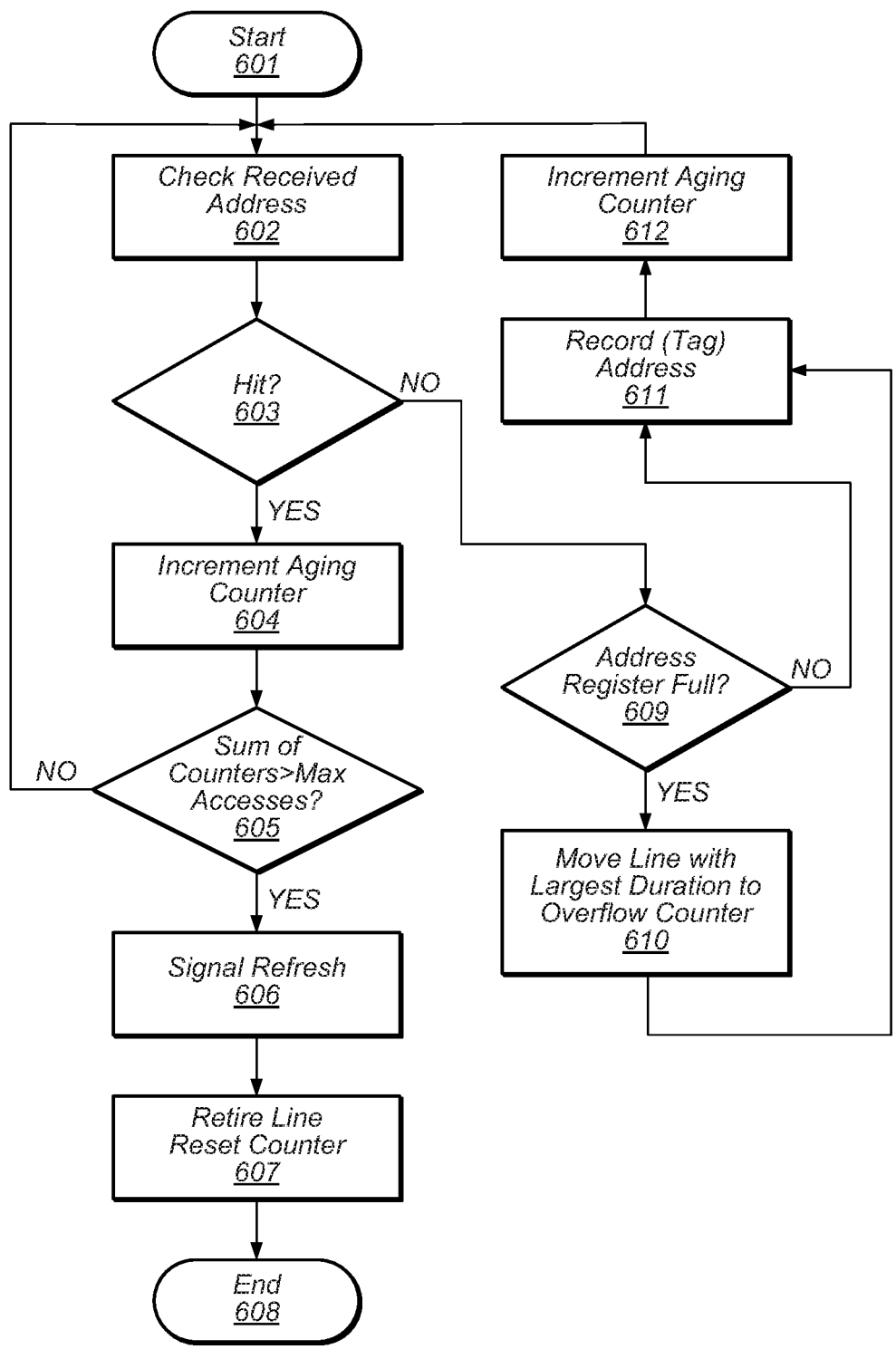
FIG. 6 illustrates a flowchart of another embodiment of a method for operating a row address cache circuit.

Turning to FIG. 6, a flowchart depicting another embodiment of operating a row address cache circuit such as, e.g., row address cache circuit 400 as illustrated in FIG. 4, during a memory access is illustrated. Referring collectively to the row address cache circuit 400 and the flowchart illustrated in FIG. 6, the method begins in block 601. The received row address may then be checked to determine if the row address cache circuit is already tracking the row address (block 602). In some embodiments, compare unit 404 may compare the received row address to each to each entry (also referred to as "line" or "cache line") in memory 401. Compare unit 404 may, in various embodiments, employ exclusive-OR logic gates or any suitable digital comparison circuit.

The method may then depend on the result of the comparison (block 603). When the comparison indicates that the received row address is not stored in a line of memory 401 (commonly referred to as a "miss" or "cache miss"), the operation may then depend on if an empty entry is available in memory 401 (block 609). When an empty entry is available, the received row address may then be stored (also referred to herein as "recorded") in memory 401 (block 611). In some embodiments, control unit 405 may issue the necessary commands to memory 401 to perform a write operation, and store the received address in memory 401. A status bit indicating that the entry in memory 401 where the received row address has been stored is occupied may, in various embodiments, be set.

Once the received row address have been stored in memory 401, a counter in aging counter 402 associated with the entry in memory 401 where in the received row address has been stored may be incremented (block 612). In some embodiments, the counter in aging counter 402 may be incremented in response to a clock signal and an enable signal generated upon the storage of a new address into memory 401. In other embodiments, the counter in aging counter 402 may be asynchronous, and the increment may be performed responsive to the end of a write cycle that stored the received row address into memory 401. Once the counter in aging counter 402 has been updated, a new address may be received, and the method may proceed from block 602 as described above.

When an empty entry in memory 401 is not available (also referred to herein as an "overflow"), a duration counter for each entry in memory 401 may then be checked, and the entry with the largest duration count, may be moved from memory 401 (block 610) to an entry in overflow counters 408. In some embodiments, once the entry has been moved, the corresponding entries in aging counters 402 and duration counters 403 may be reset. A status bit indicating that the entry is no longer being used may also be reset. Once the aforementioned entry has been move from memory 401 to an entry in overflow counters 408, the method may proceed from block 611 as described above.

When the results of the comparison indicate that the received address is stored in an entry in memory 401 (commonly referred to as a "hit" or "cache hit"), a counter in aging counters 402 corresponding to the entry in memory 401 is incremented (block 604). The method may then depend on the value of the corresponding aging and duration counters (block 605). When the sum of the values of the corresponding aging and duration counters is less than or equal to a pre-determined value, a new address may then be received and the method may then proceed as described above in regards to block 602. In some embodiments, the pre-determined value may be provided by a manufacturer of the memory being accessed while, in other embodiments, the pre-determined value may be dependent on data gather during the characterization of the memory.

When the value of the counter is greater than the pre-determined value, row address cache circuit 400 may signal a refresh is required (block 606). In some embodiments, the refresh may be a complete refresh of all addresses within the address space of the memory being accessed. Only adjacent rows to a row corresponding to the received row address may, in other embodiments, be refreshed. In various embodiments, row address cache circuit may signal a processor, such as, e.g., processor 101 of computing system 100, to initiate the refresh with the memory.

With the initiation of a refresh, the line corresponding to the received row address may be deleted (also referred to herein as "retired") from memory 401 and the corresponding entry in aging counters 402 may be reset (block 607). In some embodiments, a status bit in memory 401 may be reset, indicating that the line is no longer is use and may be re-written by future operations. Once the line has been retired, the method may then conclude in block 608.

It is noted that the method illustrated in FIG. 6 is merely an example. In other embodiments, different operations and different orders of operations are possible and contemplated.

Figure 7:
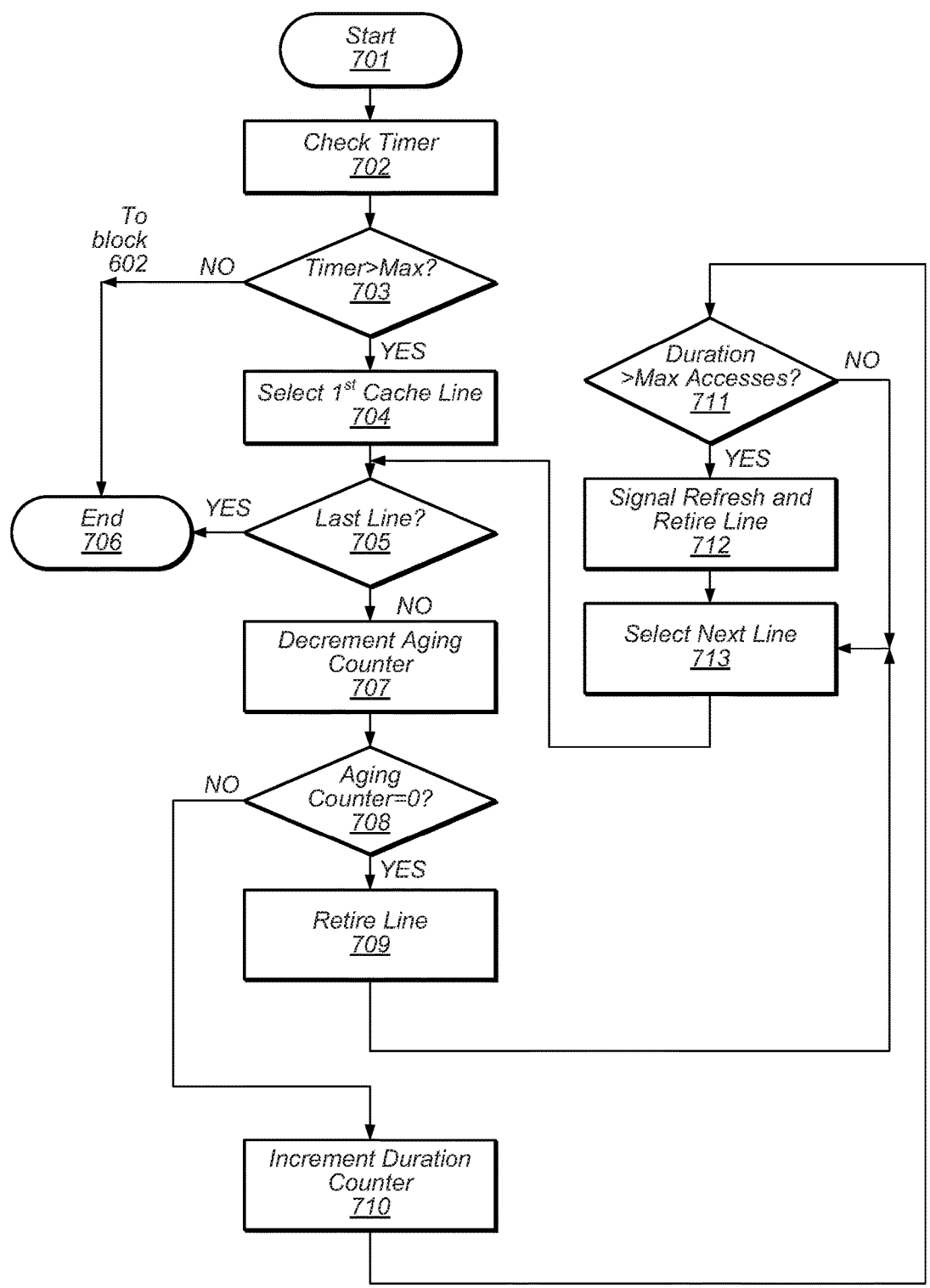
FIG. 7 illustrates a flowchart of an alternative embodiment of a method for operating a row address cache circuit.

A flowchart of another embodiment of operating a row address cache circuit, such as, e.g., row address cache circuit 400 as depicted in FIG. 4, is illustrated in FIG. 7. Referring collectively to FIG. 4 and the flowchart illustrated in FIG. 7, the method begins in block 701. A timer may then be checked (block 702). In some embodiments, the timer may be included in control circuit 405 and may be configured to determine the passage of a pre-determined period of time. The method may then depend on a state of the timer (block 703). When the timer indicates that the pre-determined period of time has not passed, the method may conclude in block 706.

When the timer indicates that the pre-determined period of time has elapsed, a first line of the memory 401 may then be selected (block 704). In some embodiments, the first line may be read from memory 401 and stored on control circuit 405. The method then depends on if the currently selected line is the last line of memory 401 (block 705).

When the currently selected line is the last line of memory 401, the method may then conclude in block 706. In some embodiments, the method may continue in block 602 of the method depicted in the flowchart illustrated in FIG. 6.

When the currently selected line is not the last line of memory 401, the corresponding aging counter in aging counters 402 may be decremented. In some embodiments, the corresponding aging counter may be decremented in a synchronous fashion while, in other embodiments, the corresponding aging counter may be decremented in an asynchronous fashion. The method may then depend on the value of the corresponding aging counter (block 708).

When the value of the aging counter corresponding to the currently selected line of memory 401 is equal to a pre-determined value, the currently selected line may then be retired from memory 401 and a refresh may be signaled (block 709). In some embodiments, the pre-determined value may be zero, or any other suitable value necessary to retire the currently selected line from memory 401. Retiring the line from memory 401 may, in some embodiments, include re-setting a status bit indicating that line is available to store a new row address value. In some embodiments, the signaled refresh may be a refresh of all addresses within the address space of the memory being accessed. Only adjacent rows to a row corresponding to the received row address may, in other embodiments, be refreshed.

When the value of the aging counter is greater than the pre-determined value, the duration counter for the currently selected line may then be incremented (block 710). As described above in regards to the aging counter, the corresponding duration counter may be incremented in a synchronous or asynchronous fashion. The method may then depend on the value of the duration counter (block 711).

When the value of the corresponding duration counter is greater than a pre-determined maximum number of accesses, the currently selected line may be retired from memory 401 (block 712). As described above in regards to block 709, retiring the currently selected line may include re-setting a status bit corresponding to the line. In some embodiments, the pre-determined maximum number of accesses may be dependent upon a refresh time of a dynamic memory. The manufacturer of the dynamic memory may, in various embodiments, provide the refresh time of the dynamic memory. In other embodiments, the pre-determined maximum value may be determined empirically, through repeated operation of the dynamic memory.

Once the currently selected line has been retired, the next line of the memory 401 may be selected (block 713). In some embodiments, the contents of the next line of memory 401 may be read and stored in control circuit 405. In other embodiments, a pointer may be incremented to indicate the next line in memory 401 currently being operated on. Once the next line of memory 401 has been selected, the method may then depend on the whether the currently selected line is the last line of memory 401 (block 705). The method may then proceed as described above in regard to block 705.

When the value of the corresponding duration counter is less than the pre-determined maximum value, the next line in memory 401 may then be selected (block 713). The method may then continue as described above in regard to block 713.

Returning to block 709, once the currently selected line has been retired, the next line of memory 401 may then be selected (block 713). The method then continues as described above in regard to block 713. Although some of the operations of the method in illustrated in FIG. 7 are depicted in as being performed in a sequential fashion, in other embodiments, one or more of the operations may be performed in parallel.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a memory including a plurality of entries, wherein each entry of the plurality of entries is configured to store a row address;
   a first plurality of counters, wherein each counter of the first plurality of counters corresponds to a respective entry of the plurality of entries in the memory;
   a second plurality of counters, wherein each counter of the second plurality of counters corresponds to a respective entry of the plurality of entries; and
   a control circuit configured to:
     receive a row address used to access a dynamic memory;
     store the row address in a first entry of the plurality of entries in response to a determination that the row address has not been previously stored in the memory;
     increment, in response to a determination that the row address has been previously stored in an entry of the plurality of entries, a value of a first counter of the first plurality of counters corresponding to the first entry of the plurality of entries;
     in response to a determination that a particular time period has elapsed since the row address was stored in the first entry, increment a value of a second counter of the second plurality of counters corresponding to the first entry;
     determine a number of times the row address has been received using the first plurality of counters;

determine a number of times the row address has been stored in the memory using the second plurality of counters; and initiate a refresh of the dynamic memory based on the value of the first counter and a value of the second counter.

2. The apparatus of claim 1, wherein the control circuit is further configured to decrement a given counter of the second plurality of counters in response to a determination that a predetermined period of time has elapse.

3. The apparatus of claim 1, wherein the control circuit is further configured to select a second entry from the plurality of entries dependent upon respective values of each counter of the second plurality of counters.

4. The apparatus of claim 3, wherein the control circuit is further configured to transfer the second entry to a first entry of the plurality of entries in response to a determination that all entries of the plurality of entries are occupied.

5. A method for operating a cache circuit, comprising:

receiving a row address, wherein the row address corresponds to a target row within a dynamic random-access memory (DRAM);

storing the row address in a memory in response to a determination that the row address has not been previously received;

in response to a determining that the row address has been previously stored in the memory, incrementing a value of a given counter of a first plurality of counters corresponding to the row address;

determining, using the first plurality of counters, a number of times the row address has been received in response to a determination that the row address has been previously received;

determining, using a second plurality of counters, a number of times the row address has been stored in the memory;

determining an amount of time that has elapsed since the row address was stored in the memory;

in response to a determining that a particular time period has elapsed since the row address was stored, incrementing a value of a given counter of the second plurality of counters corresponding to the row address; and initiating a refresh of one or more victim rows within the DRAM based on the number of times the row address has been received and the amount of time that has elapsed since the row address was stored in the memory, wherein each victim row of the one or more victim rows within the DRAM is adjacent to the target row.

6. The method of claim 5, selecting a previously stored row address in the memory dependent upon a number of times the previously stored row address has been received.

7. The method of claim 6, transferring the previously stored row address to an entry in the third plurality of counters, in response to determining that there is insufficient storage space in the memory to store the row address.

8. The method of claim 7, further comprising resetting a value of a counter corresponding to the row address in response to initiating the refresh of one or more victim rows within the DRAM.

9. A system, comprising:

a processor;

one or more dynamic random-access memories, wherein each one of the one or more dynamic random-access memories is coupled to the processor; and a row address cache circuit coupled to the processor including a memory, a first plurality of counters, a second plurality of counters, and a third plurality of counters, wherein the row address cache circuit is configured to:

receive a row address used to access at least one of the one or more dynamic random-access memories;

store the row address in the memory in response to a determination that the row address has not been previously received;

determine, using respective values of the first plurality of counters, a number of times the row address has been received in response to a determination that the row address has been previously received;

determine, using respective values of the second plurality of counters, a number of times the row address was stored in the memory; and initiate a refresh of the at least one of the one or more dynamic random-access memories based on the number of times the row address has been received and an amount of time since the row address was stored in the memory.

10. The system of claim 9, wherein the row address cache circuit is further configured to determine how long a previously stored row address has been stored.

11. The system of claim 10, wherein the row address cache circuit is further configured to decrement a given counter of the second plurality of counters corresponding to the previously stored row address in response to a determination that a predetermined period of time has elapsed.

12. The system of claim 9, wherein the row address cache circuit is further configured to select a previously stored row address based on a number of times the previously stored row address has been received.

13. The system of claim 12, wherein the row address cache circuit is further configured to transfer the previously stored row address to an entry in the third plurality of counters, in response to a determination that there is insufficient storage space in the memory.

* * * * *